(12) United States Patent
Jo

(10) Patent No.: US 7,023,694 B2
(45) Date of Patent: Apr. 4, 2006

(54) COMPUTER

(75) Inventor: Jae-young Jo, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 137 days.

(21) Appl. No.: 10/822,678

(22) Filed: Apr. 13, 2004

(65) Prior Publication Data

US 2005/0024823 A1   Feb. 3, 2005

(30) Foreign Application Priority Data

Jun. 4, 2003   (KR) .................. 10-2003-0035881

(51) Int. Cl.
*H05K 7/20* (2006.01)
*H05B 1/56* (2006.01)

(52) U.S. Cl. ................... 361/687; 361/704
(58) Field of Classification Search ............ 361/687
See application file for complete search history.

(56) References Cited

U.S. PATENT DOCUMENTS

| | | | |
|---|---|---|---|
| 6,181,559 B1 * | 1/2001 | Seo | 361/704 |
| 6,336,499 B1 * | 1/2002 | Liu | 165/80.3 |
| 6,507,491 B1 * | 1/2003 | Chen | 361/704 |
| 6,542,367 B1 * | 4/2003 | Shia et al. | 361/703 |
| 6,563,716 B1 * | 5/2003 | Truong et al. | 361/816 |
| 6,731,504 B1 * | 5/2004 | Liu | 361/704 |
| 6,771,506 B1 * | 8/2004 | Lee et al. | 361/704 |
| 6,778,395 B1 * | 8/2004 | Dong et al. | 361/704 |
| 2002/0081882 A1 | 6/2002 | Lai et al. | |

FOREIGN PATENT DOCUMENTS

| | | |
|---|---|---|
| JP | 3025510 | 3/1996 |
| JP | 3041541 | 7/1997 |
| JP | 3064327 | 9/1999 |
| JP | 3070894 | 5/2000 |
| KR | 20-247107 | 9/2001 |

* cited by examiner

*Primary Examiner*—Lisa Lea-Edmonds
*Assistant Examiner*—Ingrid Wright
(74) *Attorney, Agent, or Firm*—Staas & Halsey LLP

(57) ABSTRACT

A computer having a main casing to accommodate a plurality of hardware components such as a CPU, comprises a heat dissipating assembly which is disposed on the CPU, and includes a heat transmitter formed with a through hole, and a plurality of heat dissipating fins standing on the heat transmitter so as to dissipate heat generated by the CPU; a supporter installed in the heat dissipating fins, being disposed perpendicularly to the heat dissipating fins; a push member including a lever pivoted on the supporter, a push rod connected to the lever and passing through the through hole, the push rod moving to pass through the through hole in a direction that the heat transmitter separates from the CPU when the lever is pushed up pivoting on the supporter. With this configuration, the present invention provides a computer in which not only a CPU and a heat dissipating assembly are rapidly and readily detached from each other, but also the CPU is prevented from damage which can be occurred when the heat dissipating assembly and the CPU are detached from each other.

28 Claims, 9 Drawing Sheets

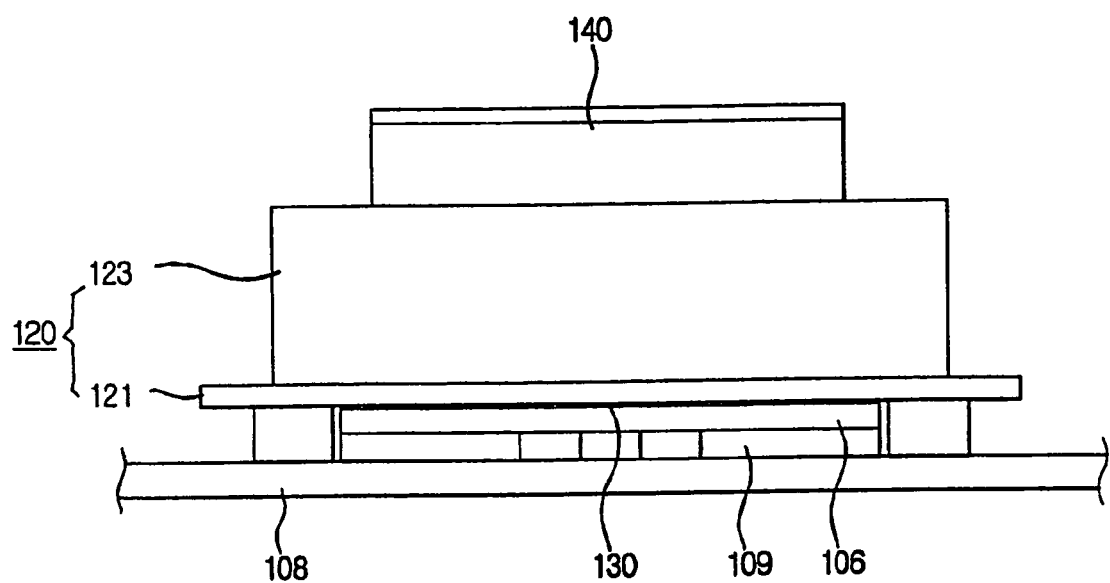

COMPUTER

CROSS-REFERENCE TO RELATED APPLICATIONS

This application claims the benefit of Korean Patent Application No. 2003-35881, filed Jun. 4, 2003, in the Korean Intellectual Property Office, the disclosure of which is incorporated herein by reference.

BACKGROUND OF THE INVENTION

1. Field of the Invention

The present invention relates to a computer, and more particularly, to a computer in which a CPU (Central Processing Unit) and a heat dissipating assembly are readily detached from each other.

2. Description of the Related Art

Generally, when a computer is turned on, a power supply supplies electric power to components provided in the computer's main body, thereby operating the computer. At this time, the components as well as the power supply generate heat. The components generally include a CPU and various other elements which are mounted on a main board, such as a hard disk drive, various controllers, and other drives.

The heat generated inside the computer's main body can not only cause the computer to malfunction, but can also shorten the lifespan of the computer and/or the components. Therefore, to optimize the computer, the heat should be effectively dissipated.

For example, as shown in FIGS. 8 and 9, a heat dissipating assembly is provided on a CPU 106 to effectively dissipate the heat generated by the CPU 106 which is inserted into a CPU socket 109 mounted onto a main board 108.

The heat dissipating assembly comprises: a heat sink 120 that includes a heat transmitter 121 attached to the CPU 106, and a plurality of heat dissipating fins 123 formed on the heat transmitter 121; and a cooling fan 140 provided on the heat sink 120 to cool the heat sink 120. A thermal pad or thermal greaser is interposed between the heat transmitter 121 and the CPU 106 to reduce thermal resistance there between. In FIG. 9, reference numeral 130 indicates the thermal pad or the thermal grease interposed between the heat transmitter 121 and the CPU 106.

The heat transmitter 121 is shaped like a flat plate to be attached onto the CPU 106. The plurality of heat dissipating fins 123 stand on the heat transmitter 121 at regular intervals. Thus, the heat transmitted to the heat dissipating fins 123 is rapidly dissipated due to air ventilation between the heat dissipating fins 123.

The cooling fan 140 is used to cool the heat dissipating fins 123 to which the heat is transmitted from the CPU 106 through the heat transmitter 121. The cooling fan 140 is driven by power from a power supply (not shown) and generates a wind by rotating the blades 141. The wind generated by the cooling fan 140 ventilates the heat dissipating fins 123, thereby dissipating the heat transmitted to the heat dissipating fins 123.

When the CPU 106 needs to be replaced, the heat dissipating assembly is first detached from the CPU 106, and the CPU 106 is then separated from the CPU socket 109 in sequence so as to prevent damage. However, the heat generated by the CPU 106 can melt the thermal pad 130 or the thermal grease 130 interposed between the heat transmitter 121 and the CPU 106. As a result, the heat transmitter 121 is likely to stick to the CPU 106. When the heat transmitter 121 sticks to the CPU 106 it is difficult to detach only the heat dissipating assembly from the CPU 106, leaving the CPU 106 inserted into the CPU socket 109. That is, when attempting to detach the heat dissipating assembly from the CPU 106, the CPU 106 is instead separated from the CPU socket 109.

Hence, in the case where the heat transmitter 121 sticks to the CPU 106 due to a melted thermal pad 130 or thermal grease 130, the CPU 106 is separated from the CPU socket 109 when attempting to detach the heat dissipating assembly from the CPU 106 and thus, the CPU 106 and the CPU socket 109 can be damaged.

SUMMARY OF THE INVENTION

Accordingly, it is an aspect of the present invention to provide a computer in which a CPU and a heat dissipating assembly are readily detached from each other.

Additional aspects and advantages of the invention will be set forth in part in the description which follows and, in part, will be obvious from the description, or may be learned by practice of the invention.

The foregoing and/or other aspects of the present invention are achieved by providing a computer having a main casing to accommodate a plurality of hardware components such as a CPU, comprising: a heat dissipating assembly, disposed on the CPU, and including a heat transmitter formed with a through hole and a plurality of heat dissipating fins standing on the heat transmitter so as to dissipate heat generated by the CPU; a supporter installed in the heat dissipating fins, the supporter disposed perpendicularly to the heat dissipating fins; a push member, including a lever pivoted on the supporter and a push rod connected to the lever and passing through the through hole. The push rod travels through the through hole in a direction such that the heat transmitter separates from the CPU when the lever is pushed up and pivots on the supporter.

According to an aspect of the present invention, the push rod is parallel with the heat dissipating fins, and the lever which is perpendicular to or otherwise transverse to the dissipating fins has a first end connected to the push rod and a second end exposed to the outside of the heat dissipating fins.

According to an aspect of the present invention, the computer further comprises a hinge to rotatably connect the push rod with the lever, wherein the hinge includes a hinge hole formed in both the push rod and the lever and a hinge pin rotatably inserted in the hinge hole.

According to an aspect of the present invention, the computer further comprises a flange radially protruding from the push rod and a spring member having a first end supported by the flange and a second end supported by the heat transmitter.

According to an aspect of the present invention, the computer further comprises a groove, formed on the lever and supported by the supporter, and supporter holes formed on the heat dissipating fins. The supporter holes are arranged perpendicularly to the respective heat dissipating fins such that the supporter is inserted in the supporter holes.

According to an aspect of the present invention, the main casing accommodates a main board mounted with a CPU socket into which the CPU is inserted and a thermal resistance reducer is interposed between the CPU and the heat transmitter to reduce thermal resistance.

According to an aspect of the present invention, the heat dissipating assembly further includes a cooling fan disposed on the heat dissipating fins to cool the heat dissipating fins.

BRIEF DESCRIPTION OF THE DRAWINGS

These and/or other aspects and advantages of the present invention will become apparent and more readily appreciated from the following description of the embodiments, taken in conjunction with the accompany drawings of which:

FIG. 9 is a side view of FIG. 8.

DETAILED DESCRIPTION OF THE PREFERRED EMBODIMENTS

Figure 1:
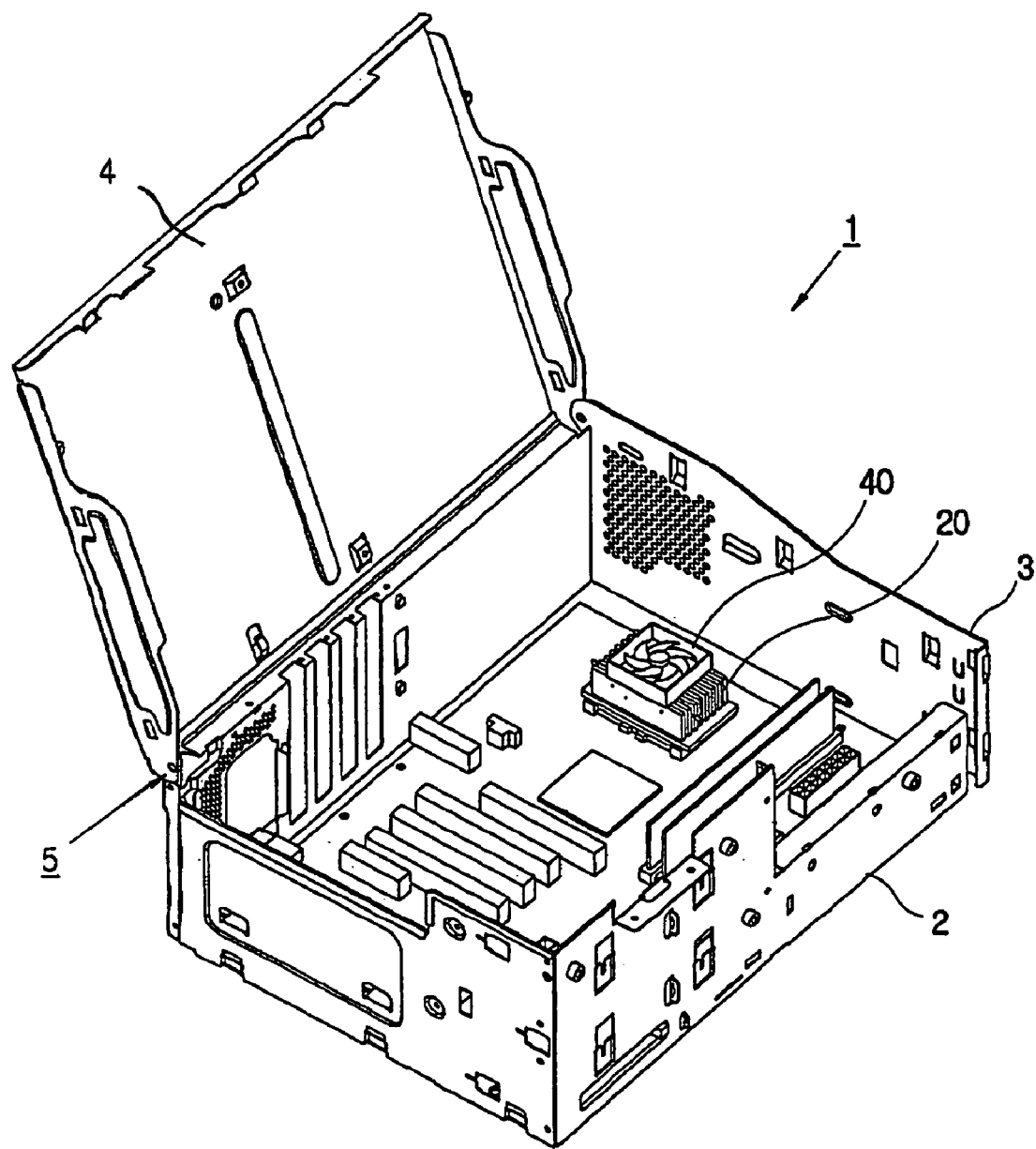
FIG. 1 is a perspective view of a computer main body according to the present invention.

Reference will now be made in detail to embodiments of the present invention, examples of which are illustrated in the accompanying drawings, wherein like reference numerals refer to like elements throughout. The embodiments are described below in order to explain the present invention by referring to the figures.

Figure 2:
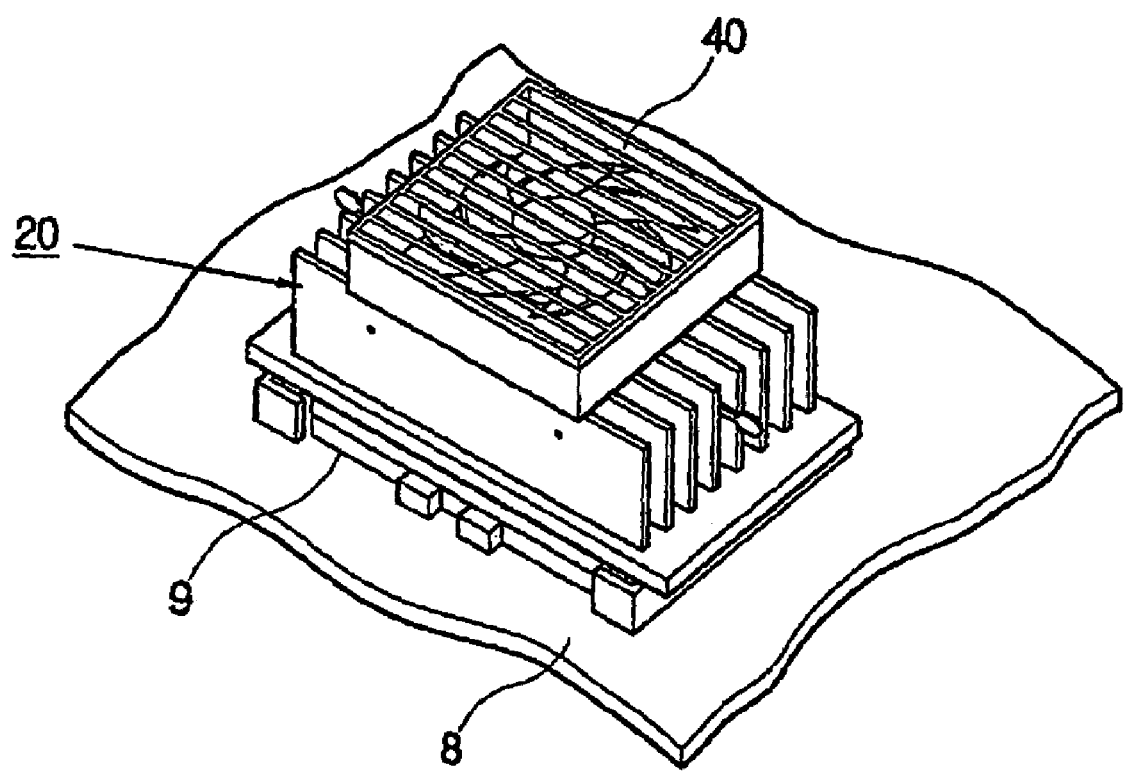
FIG. 2 is a partially enlarged perspective view showing the vicinity of a CPU mounted on a main board provided in the computer main body of FIG. 1.

FIG. 1 is a perspective view of a computer main body according to an aspect of the present invention. FIG. 2 is a partially enlarged perspective view showing the vicinity of a CPU mounted on a main board provided in the computer main body of FIG. 1. As shown in FIG. 1, a computer main body 1 according to the present invention comprises a main casing 2 having an open top 3 and accommodating a plurality of hardware components, a casing cover 4 to cover the open top 3, a hinge 5 provided in the rear of the open top 3 to allow the main casing 2 to rotatably support the casing cover 4, and a locking/releasing mechanism (not shown) to allow the casing cover 4 to be locked to and/or released from the main casing 2.

Figure 3:
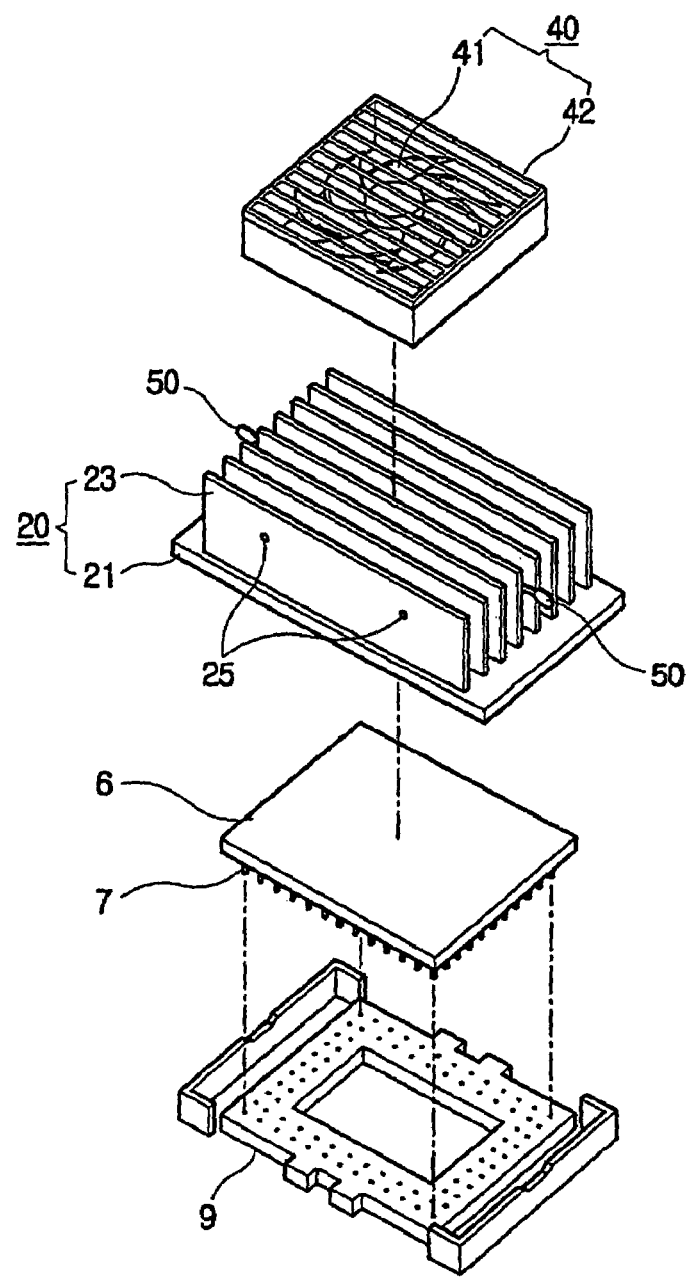
FIG. 3 is an exploded perspective view of FIG. 2, showing a heat dissipating assembly and the CPU.

As shown in FIGS. 2 and 3, the main casing 2 forms an accommodating space and the open top 3. The accommodating space accommodates a main board 8 mounted with a CPU 6, a RAM (random access memory: not shown), and a plurality of hardware components including a hard disk drive, etc. Here, the CPU 6 has a plurality of connection pins 7 and the plurality of connection pins 7 is inserted into a CPU socket 9 mounted on the main board 8 so that the CPU 6 is mounted onto the main board 8.

Figure 4:
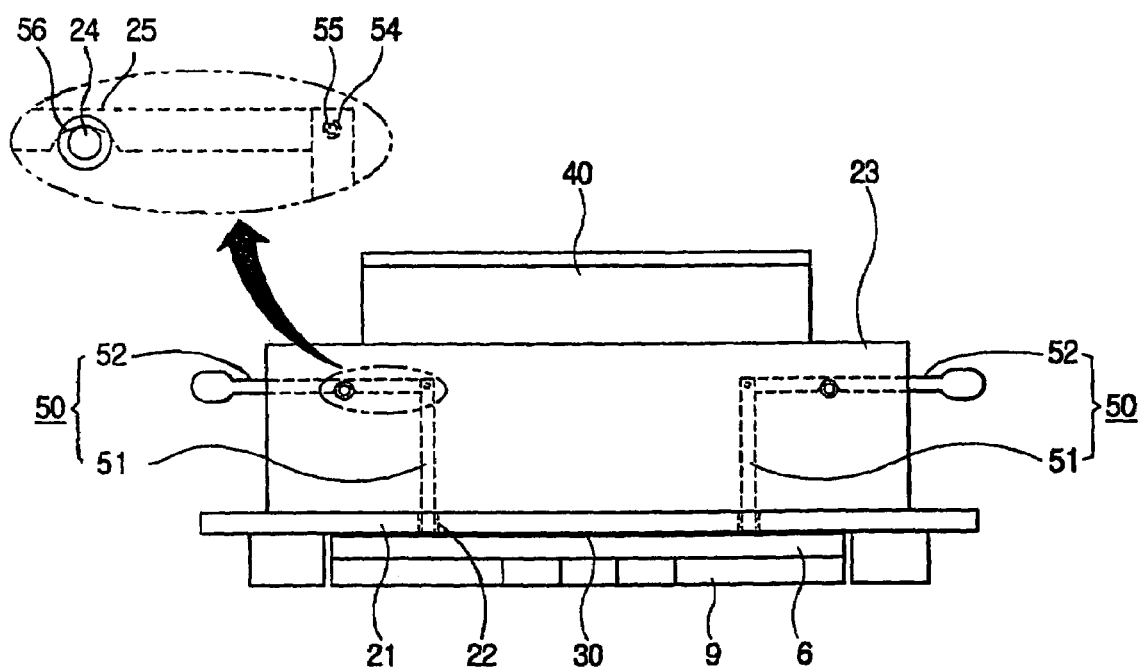
FIGS. 4 and 5 are side views illustrating operations of a push member provided in the heat dissipating assembly of FIG. 3, according to an embodiment of the present invention.

As shown in FIGS. 2, 3, and 4, a heat dissipating assembly to dissipate heat generated by the CPU 6 is provided on the CPU 6. Between the heat dissipating assembly and the CPU 6 is interposed a thermal resistance reducer 30 to reduce thermal resistance therebetween. Here, the thermal resistance reducer 30 includes a thermal pad or a thermal grease. In this aspect, a thermal pad is employed as the thermal resistance reducer 30, by way of example. Other thermal resistance reducers 30 may be used.

The heat dissipating assembly comprises a heat sink 20 including a heat transmitter 21 attached to the CPU 6 and a plurality of heat dissipating fins 23 formed on the heat transmitter 21; and a cooling fan 40 disposed on the heat dissipating fins 23 of the heat sink 20.

The heat transmitter 21 is shaped like a flat plate (shown here as rectangular) and is attached to the CPU 6, sandwiching the thermal pad 30 there between. A through hole 22 through which a push member 50 (to be described later) passes is formed in the heat transmitter 21.

The plurality of heat dissipating fins 23 stand on the heat transmitter 21 at regular intervals. Thus, the heat transmitted to the heat dissipating fins 23 is rapidly dissipated due to ventilation between the heat dissipating fins 23. The heat dissipating fins 23 are formed with supporter holes 25. The supporter holes 25 are formed perpendicular to their respective heat dissipating fins 23 and parallel to the heat transmitter 21.

The cooling fan 40 is used to cool the heat dissipating fins 23 to which the heat is transmitted from the CPU 6 through the heat transmitter 21. The cooling fan 40 comprises rotating a blade 41 driven by power from a power supply (not shown) so as to generate a wind, and a fan housing 42 to house the blade 41. The wind generated by the rotation of the blade 41 ventilates the heat dissipating fins 23, thereby dissipating the heat transmitted to the heat dissipating fins 23 of the heat sink 20.

As shown in FIGS. 4 through 7, the heat dissipating assembly includes a push member 50 to readily separate the heat dissipating assembly from the CPU 6 and a supporter 24 to support the push member 50.

The supporter 24 is inserted into the supporter holes 25 of the heat dissipating fins 23 so that the supporter 24 is parallel with the heat transmitter 21 and perpendicular to the heat dissipating fins 23.

The push member 50 comprises a push rod 51 passing through the through hole 22 of the heat transmitter 21, a lever 52 to lift the push rod 51 up and down through the through hole 22, and a hinge rotatably connecting the push rod 51 with the lever 52.

The push rod 51 is disposed parallel with the heat dissipating fins 23, having a first end passing through the through hole 22 and a second end connected to the lever 52 by the hinge.

The lever 52 is disposed perpendicular to the heat dissipating fins 23, having a first end rotatably connected to the push rod 51 by the hinge and a second end exposed to the outside of the heat dissipating fins 23 and operated by a user. Further, the lever 52 is formed with a groove 56 to be pivoted on the supporter 24.

The hinge includes hinge holes 54 respectively formed in both the push rod 51 and the lever 52 and a hinge pin 55 rotatably inserted in the hinge holes 54.

Figure 5:
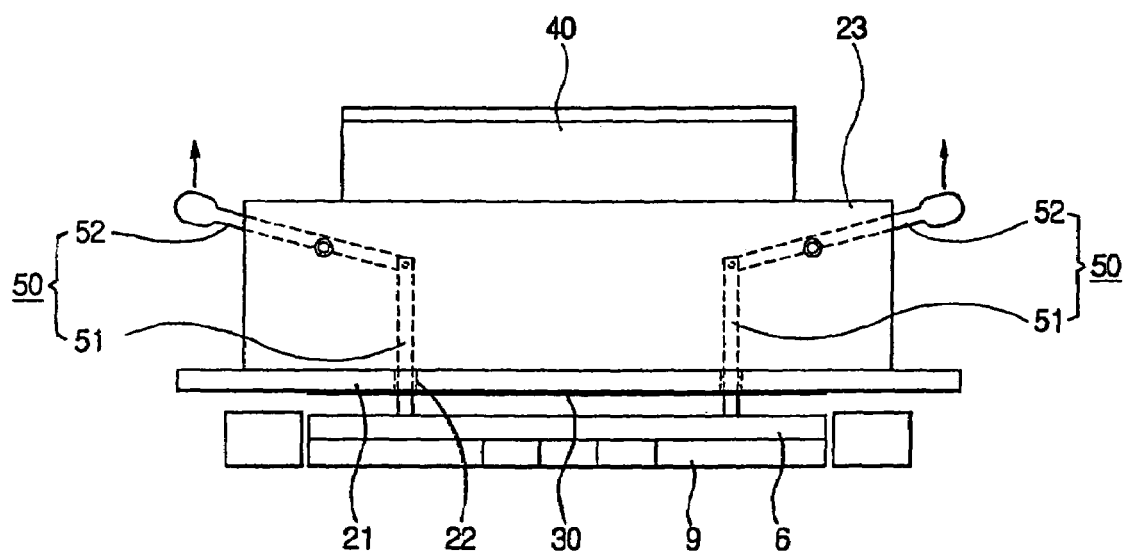

With the configuration shown in FIGS. 4 and 5, to remove the CPU 6 a user pushes up the lever 52 which pivots on the supporter 24 so that the push rod 51 simultaneously moves down toward the CPU 6 passing through the through hole 22 in correspondence to the pivoting of the lever 52. At this time, the push rod 51 pushes the CPU 6 away from the heat transmitter 21 so that the heat transmitter 21 is detached from the CPU 6. Therefore, the heat dissipating assembly can be first detached from the CPU 6 and the CPU 6 can be then separated from the CPU socket 9 in sequence.

Figure 6:
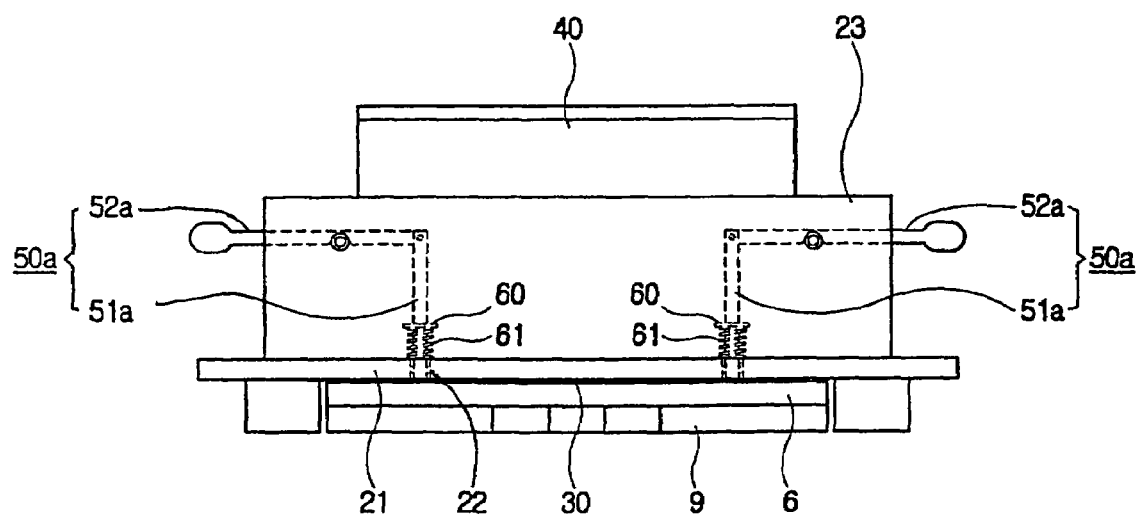
FIGS. 6 and 7 are side views illustrating operations of the push member of FIGS. 4 and 5 respectively, according to an aspect of the present invention.
Figure 7:
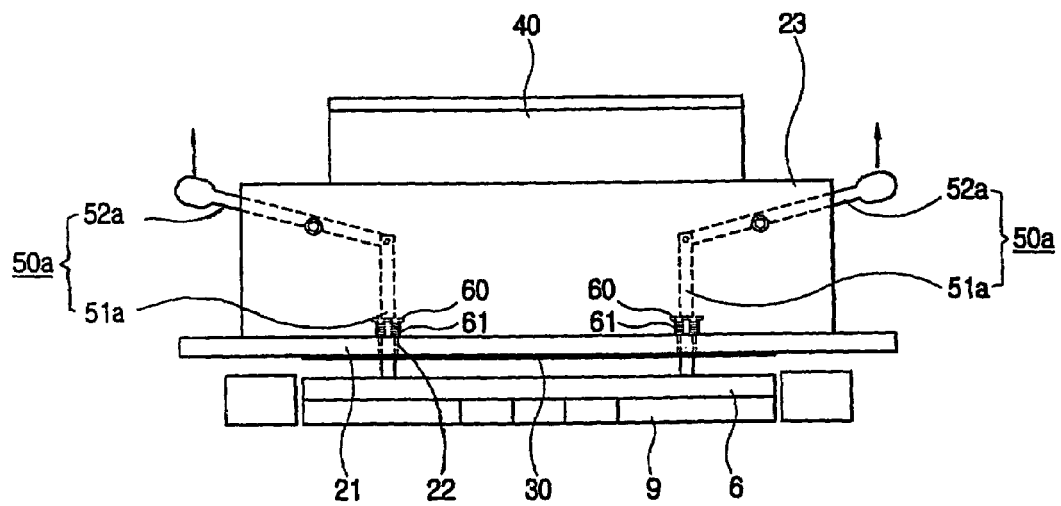
Figure 8:
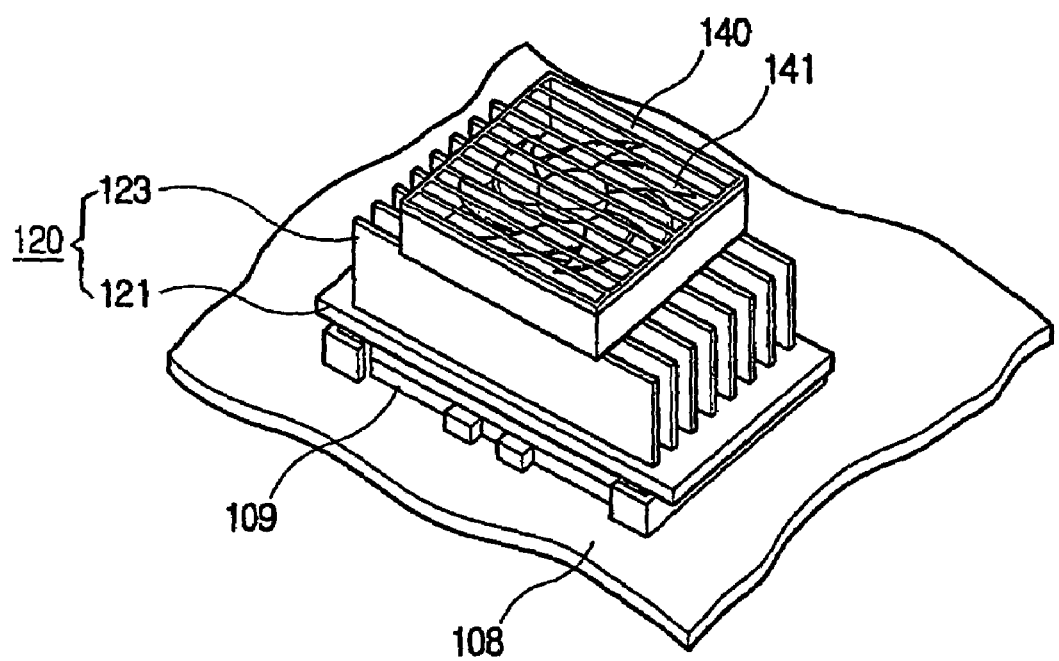
FIG. 8 is a partially enlarged perspective view showing the vicinity of a CPU with a conventional heat dissipating assembly.

According to another aspect of the present invention as shown in FIGS. 6 and 7, a flange 60 and a spring 61 are added to the heat dissipating assembly shown in FIGS. 4 and 5. By adding the flange 60 and the spring 61, a lever 52a of a push member 50a is elastically returned to an original position from a pushed-up position. The flange 60 is formed on the push rod 51a and the spring member 61 is interposed between the flange 60 and a heat transmitter 21.

The flange 60 is radially protruded from the push rod 51a, to support a first end of the spring member 61. A second end of the spring member 61 is supported by the heat transmitter 21.

Therefore, when a user pushes up the lever 52a to separate the heat dissipating assembly from the CPU 6 the push rod 51a moves down toward the CPU 6 and the spring member 61 is compressed between the flange 60 and the heat transmitter 21. Thereafter, when a user releases the lever 52a, the elasticity of the spring member 61 makes the push rod 51a and the lever 52a elastically move toward their original positions.

In the above described embodiments, the present invention is applied to a computer main body 1 comprising the casing cover 4 rotatably combined to the main casing 2, but may be applied to various types of a computer main bodies.

As described above, the present invention provides a computer in which not only a CPU and a heat dissipating assembly are rapidly and readily detached from each other, but also damage which can occur when the heat dissipating assembly and the CPU are detached from each other is prevented.

Although a few embodiments of the present invention have been shown and described, it would be appreciated by those skilled in the art that changes may be made in these embodiments without departing from the principles and spirit of the invention, the scope of which is defined in the appended claims and their equivalents.

What is claimed is:

1. A computer having a main casing to accommodate a plurality of hardware components such as a CPU, comprising:
   a heat dissipating assembly which is disposed on the CPU and includes a heat transmitter formed with a through hole and a plurality of heat dissipating fins standing on the heat transmitter so as to dissipate heat generated by the CPU;
   a supporter installed in the heat dissipating fins, the supporter being disposed perpendicularly to the heat dissipating fins; and
   a push member comprising;
      a lever pivoted on the supporter, and
      a push rod connected to the lever and passing through the through hole, the push rod traveling through the through hole in a direction such that the heat transmitter separates from the CPU when the lever is operated.

2. The computer according to claim 1, wherein the lever is operated by lifting the lever away from the CPU so that the lever pivots on the supporter.

3. The computer according to claim 1, wherein the push rod is parallel with the heat dissipating fins.

4. The computer according to claim 3, wherein the lever is transverse to the heat dissipating fins and comprises:
   a first end connected to the push rod, and
   a second end exposed to an outside of the heat dissipating fins.

5. The computer according to claim 4, further comprising a hinge to rotatably connect the push rod with the lever, wherein the hinge includes hinge holes respectively formed in both the push rod and the lever, and a hinge pin rotatably inserted in the hinge holes.

6. The computer according to claim 1, further comprising:
   a flange radially protruding from the push rod, and
   a spring member having a first end supported by the flange and a second end supported by the heat transmitter, wherein the spring returns the lever to an original position after the lever is operated.

7. The computer according to claim 6, further comprising:
   a groove formed on the lever and supported by the supporter, and
   supporter holes formed on the heat dissipating fins, the supporter holes being arranged perpendicularly to the respective heat dissipating fins, wherein the supporter is inserted in the supporter holes and the supporter is parallel with the heat transmitter.

8. The computer according to claim 7, wherein the main casing accommodates a main board mounted with a CPU socket into which the CPU is inserted.

9. The computer according to claim 8, wherein a thermal resistance reducer is interposed between the CPU and the heat transmitter to reduce thermal resistance.

10. The computer according to claim 9, wherein the thermal resistance reducer is a thermal pad or a thermal grease.

11. The computer according to claim 9, wherein the heat dissipating assembly further comprises a cooling fan disposed on the heat dissipating fins to cool the heat dissipating fins.

12. The computer according to claim 3, further comprising:
   a flange radially protruded from the push rod, and
   a spring member having a first end supported by the flange and a second end supported by the heat transmitter.

13. The computer according to claim 12, further comprising:
   a groove formed on the lever and supported by the supporter, and
   supporter holes formed on the heat dissipating fins, the supporter holes being arranged perpendicularly to the respective heat dissipating fins, wherein the supporter is inserted in the supporter holes.

14. The computer according to claim 13, wherein the main casing accommodates a main board mounted with a CPU socket into which the CPU is inserted.

15. The computer according to claim 14, wherein a thermal resistance reducer is interposed between the CPU and the heat transmitter to reduce thermal resistance.

16. The computer according to claim 15, wherein the thermal resistance reducer is a thermal pad or a thermal grease.

17. The computer according to claim 15, wherein the heat dissipating assembly further comprises a cooling fan disposed on the heat dissipating fins to cool the heat dissipating fins.

18. The computer according to claim 5, further comprising:
   a flange radially protruded from the push rod, and
   a spring member having a first end supported by the flange and a second end supported by the heat transmitter.

19. The computer according to claim 18, wherein when the lever is operated, the push rod presses against the CPU and the spring is compressed between the flange and the heat transmitter, and when the lever is released, the spring returns the lever to an original position.

20. The computer according to claim 18, further comprising:
   a groove formed on the lever and supported by the supporter, and supporter holes formed on the heat dissipating fins, the supporter holes being arranged perpendicularly to the respective heat dissipating fins, wherein the supporter is inserted in the supporter holes.

21. The computer according to claim 20, wherein the main casing accommodates a main board mounted with a CPU socket into which the CPU is inserted.

22. The computer according to claim 21, wherein a thermal resistance reducer is interposed between the CPU and the heat transmitter to reduce thermal resistance.

23. The computer according to claim 22, wherein the thermal resistance reducer is a thermal pad or a thermal grease.

24. The computer according to claim 22, wherein the heat dissipating assembly further comprises a cooling fan disposed on the heat dissipating fins to cool the heat dissipating fins.

25. The computer according to claim 23, wherein damage to the CPU is minimized by separating the CPU from the CPU socket only after operating the lever and thereby separating the heat transmitter from the CPU.

26. A computer, comprising:
a CPU;
a heat transmitter to dissipate heat generated by the CPU, the heat transmitter formed with a through hole;
a thermal resistance reducer interposed between the CPU and the heat transmitter to reduce thermal resistance;
a supporter,
a lever pivoted on the supporter, and
a push rod connected to the lever and passing through the through hole such that when the lever is operated, the push rod travels through the through hole in a direction such that the heat transmitter is separated from the CPU.

27. The computer of claim 26, further comprising:
a plurality of through holes formed in the heat transmitter; and
a plurality of push rods connected to the lever such that when the lever is operated, the plurality of push rods travel through the plurality of through holes, respectively, in a direction such that the heat transmitter is separated from the CPU.

28. An apparatus separating a heat transmitter and a CPU, comprising:
a supporter combined with the heat transmitter,
a lever pivoted on the supporter, and
a push rod connected to the lever and contacting the CPU such that when the lever is operated, the push rod forces the heat transmitter away from the CPU, thereby separating the heat transmitter from the CPU.

* * * * *